United States Patent [19]
Smith et al.

[11] Patent Number: 5,224,023
[45] Date of Patent: Jun. 29, 1993

[54] FOLDABLE ELECTRONIC ASSEMBLY MODULE

[76] Inventors: Gary W. Smith, 12376 Oakwood Rd., San Diego, Calif. 92129; Chris Karabatsos, 42 Jumping Brook La., Kingston, N.Y. 12401

[21] Appl. No.: 833,997
[22] Filed: Feb. 10, 1992
[51] Int. Cl.$^5$ .................................. H05R 1/11
[52] U.S. Cl. .................................. 361/412; 174/254; 361/398; 361/413; 439/67
[58] Field of Search .................. 29/829; 174/255, 254; 361/396, 398, 412, 413, 414; 439/67, 77

[56] References Cited

U.S. PATENT DOCUMENTS

| | | | |
|---|---|---|---|
| 3,242,384 | 3/1966 | Klehm, Jr. | 361/398 |
| 3,766,439 | 10/1973 | Isaacson | 361/398 |
| 3,873,889 | 3/1975 | Leyba | 361/398 |
| 4,338,149 | 7/1982 | Quaschner | 29/829 |
| 4,495,546 | 1/1985 | Nakamura et al. | 361/398 |
| 4,509,095 | 4/1985 | Boros | 439/77 |
| 4,567,543 | 1/1986 | Miniet | 361/398 |
| 4,781,601 | 11/1988 | Kuhl et al. | 439/77 |
| 4,928,206 | 5/1990 | Porter et al. | 439/77 |
| 5,095,628 | 3/1992 | McKenney et al. | 434/67 |

FOREIGN PATENT DOCUMENTS

| | | | |
|---|---|---|---|
| 2423144 | 11/1975 | Fed. Rep. of Germany | 361/398 |
| 3140061 | 2/1983 | Fed. Rep. of Germany | 439/77 |
| 55-121670 | 9/1980 | Japan | 357/80 |
| 2-250388 | 10/1990 | Japan | 439/67 |

OTHER PUBLICATIONS

IBM Disclosure Bulletin "Module Test Socket" by Kam vol. 22 No. 8A Jan. 1980.

*Primary Examiner*—Leo P. Picard
*Assistant Examiner*—Donald Sparks
*Attorney, Agent, or Firm*—Henri J. A. Charmasson

[57] ABSTRACT

An electronic assembly combines a number of commensurate printed circuit boards bonded to a common, flexible, interconnecting substrate in an alternately folded and layered arrangement against an end board that has a comb of terminals for mounting into a motherboard connector. The flexible substrate is sandwiched between half-sections of each board, allowing mounting of components from both faces of the board. The assembly is particularly indicated for high density applications such as memory modules.

11 Claims, 1 Drawing Sheet

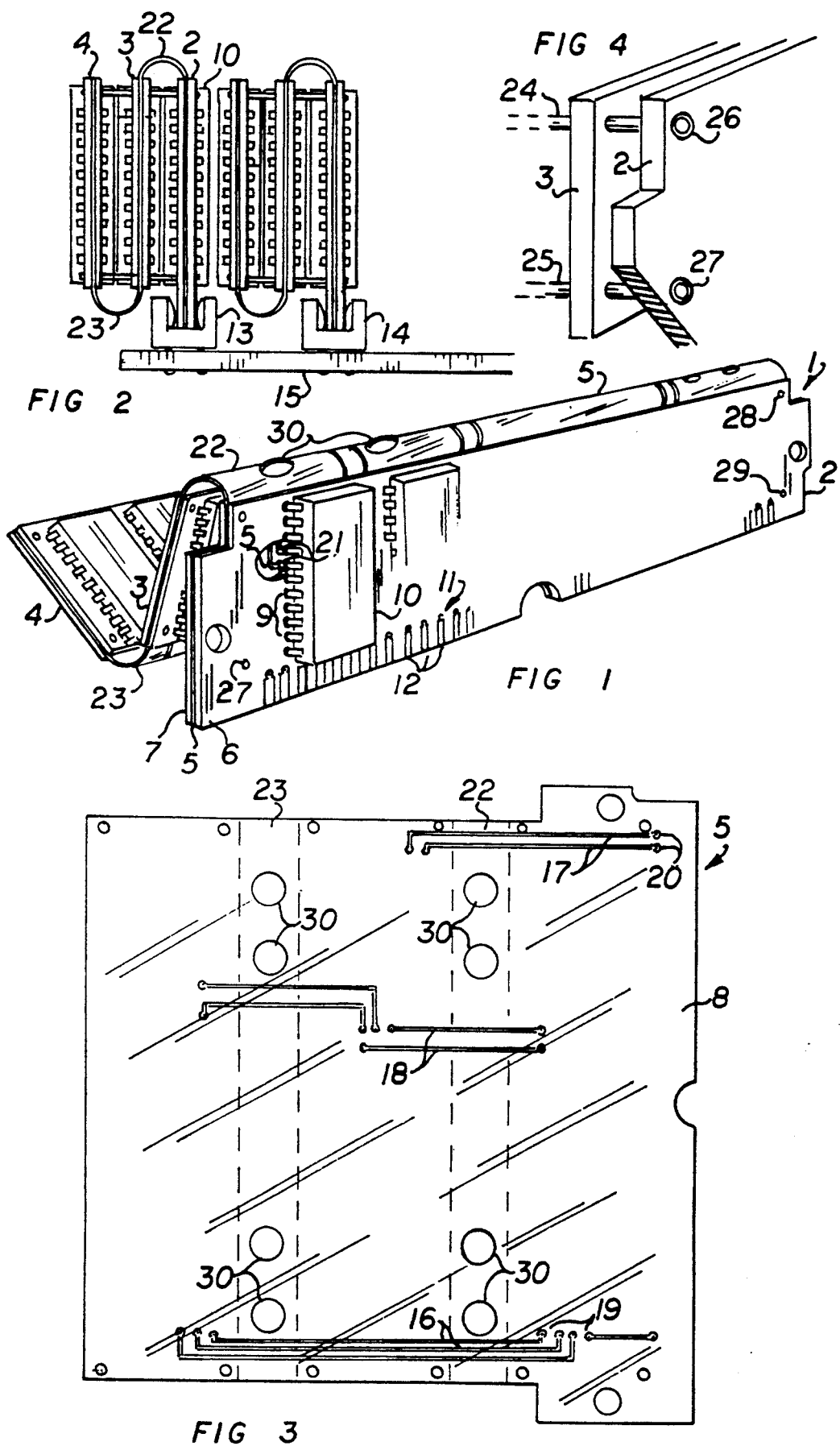

5,224,023

FOLDABLE ELECTRONIC ASSEMBLY MODULE

FIELD OF THE INVENTION

This invention relates to the art of electronic circuit packaging, and more specifically to the packaging of high density integrated circuits on groups of printed circuit boards plugged into a motherboard.

BACKGROUND OF THE INVENTION

Designers of electronic circuits are forever striving to reduce the size of electronic assemblies through miniaturization of the electronic components and maximum space utilization. The assembly of modern high-speed memory modules requires the grouping of integrated circuit packages in a closely interconnected configuration. The packaging configuration must be flexible enough to allow expansion of the memory capacity by addition or substitution of components where the space unused in a low memory capacity system must be balanced against the memory expanding capability.

There is a need for an improved packaging technique which would provide for the convenient expansion of a memory module without requiring a large space allocation in the basic, low-memory configuration of the module.

SUMMARY OF THE INVENTION

The principal and secondary objects of this invention are to provide a packaging technique for assembling expandable memory modules in a compact arrangement which does not require substantial space allocation for future expansion; and to allow the fabrication of memory modules of different capacities in a same compact package configuration.

These and other objects are achieved by combining a number of printed circuit boards of substantially the same size, bonded to a common flexible interconnecting substrate in an alternately folded and layered arrangement against a end board having a comb of terminals for mounting into a motherboard connector. The flexible substrate is sandwiched between half-sections of each board; allowing mounting of components on both faces of the board.

BRIEF DESCRIPTION OF THE DRAWING

FIG. 1 is a perspective view of a memory module assembly according to the invention;

FIG. 2 is a side elevational view of the mounting of two of such assemblies on a motherboard;

FIG. 3 is a plan view of an interconnecting substrate; and

FIG. 4 is a perspective view of a section of the assembly illustrating the board-holding posts.

DESCRIPTION OF THE PREFERRED EMBODIMENTS OF THE INVENTION

Referring now to the drawing there is shown in FIG. 1 a memory module assembly 1 which combines three printed circuit boards 2, 3, 4 joined together by a flexible substrate 5. Each board consists of two half-sections 6, 7 laminated together to a section 8 of the flexible substrate 5 sandwiched therebetween. Each of the two half-sections has pads 9 for mounting integrated circuits 10 or other electronic components. A masterboard 2 has a comb 11 of printed terminals for engagement into a connector 13, 14 mounted on a PC board 15, or for direct soldering onto the PC board. The substrate 5 is made from a sheet of resin or other laminated insulating material, and carries conductive leads 16, 17, 18. These leads interconnect various points or stations 19, 20, on the substrates. Station 19 lines up with pads 9 on the board 2 and are connected to them by feed-throughs 21. Similarly, stations 20 on the substrate are connected to terminals 12 of the comb 11. The section of substrate 22 which lies in the gap between two parallely spaced-apart boards 2 is wide enough to allow placement of boards 3 in a parallel, face-to-face, layered arrangement with board 2 as more specifically illustrated in FIG. 2. Similarly, the section of substrate 23 which lies between board 3 and board 4, is wide enough to allow the stacking of board 4 against board 3 by folding section 23 of the substrate 5. The boards 2, 3, 4 are held together in their stack configuration by posts 24, 25 which are passed through and soldered to, feed-throughs 26, 27 and 28, 29 in the respective boards, as illustrated in FIG. 4. Holes 30 cut through the gap sections 22, 23 of the substrate facilitates air circulation between the modules for better cooling action.

The leads and stations can be formed on the substrate by printing, vacuum deposit, etching or any other convenient and conventional process.

It should be noted that, as illustrated in FIG. 2, three-board modules with integrated circuit components mounted on both sides of each board can be conveniently packaged in the standard 1.25 centimeters (0.5 inch) gap between two motherboard connectors 13, 14. This type of electronic assembly can be extended by increasing the height of each board, or the number of those boards.

While the preferred embodiment of the invention has been described, modifications can be made and other embodiments may be devised without departing from the spirit of the invention and the scope of the appended claims.

What is claimed is:

1. An electronic assembly which comprises:
   a flexible, insulating substrate having a network of conductive leads and connecting stations applied thereto;
   at least two substantially quadrangular circuit boards;
   each of said boards laminarly split into substantially symmetric half-sections;
   each of said half-sections having pads on a first face for mounting electronic components;
   each of said half-sections having an opposite second face bonded to said substrate;
   said half-sections laminated together on either side of a portion of the substrate sandwiched therebetween;
   said boards bonded in a side-by-side, parallely spaced-apart configuration;
   a first of said boards having a comb of connecting terminals integral with said first board along a first edge;
   said comb sized and dimensioned to engage a connecting port on a supporting structure;
   a plurality of feed-through connections on each of said boards interconnecting a plurality of said pads and terminals with said connecting stations;
   wherein any gap between two parallely spaced-apart edges of any two adjacent boards is wide enough to allow mounting of said boards in a parallel, face-to-face, layered arrangement by folding said substrate at said gap;

said gap being wide enough to allow for an air space between any opposite facing components attached to separate boards; and, said gap having no components attached thereto.

2. The assembly of claim 1, wherein a second an da third of said boards are successively and alternately folded in a parallel and layered arrangement with respect to the first board, thereby allowing said network of conductive leads to lie in same electronic plane facilitating memory module access design.

3. The assembly of claim 1, which comprises means for holding said boards in said parallel and layered arrangement.

4. The assembly of claim 3, wherein said means for holding comprise:
each of said boards having at least one feed-through;
said feed-throughs sized, dimensioned and positioned in alignment to accommodate passage of at least one post through said feed-throughs.

5. A plurality of the assembly of claim 1 in combination with a row of parallel, spaced-part connectors mounted on a supporting structure shaped and dimensioned to engage said comb of terminals.

6. The assembly of claim 1 wherein said comb is the only electronic connection point between said assembly and said supporting structure.

7. The assembly of claim 6 wherein said comb is the only mechanical connection point between said assembly and said supporting structure.

8. The assembly of claim 1 wherein said connecting port comprises a Single In line Memory Module (SIMM) style port.

9. The assembly of claim 1 wherein said pads are sized, dimensioned and positioned to electronically engage memory integrated circuit modules.

10. The assembly of claim 2 wherein said arrangement is less than 1.25 centimeters thick.

11. The assembly of claim 1 which further comprises:
means for cooling said assembly which comprise a plurality of holes through said substrate at said gap.

* * * * *